(12) United States Patent
Dickman et al.

(10) Patent No.: US 7,511,540 B2
(45) Date of Patent: Mar. 31, 2009

(54) DRIVER CIRCUIT FOR PROVIDING AN OUTPUT SIGNAL

(75) Inventors: Rory Dickman, Graz (AT); Heinrich Trebo, Graz (AT)

(73) Assignee: Infineon Technologies AG, Munich (DE)

( * ) Notice: Subject to any disclaimer, the term of this patent is extended or adjusted under 35 U.S.C. 154(b) by 56 days.

(21) Appl. No.: 11/689,163

(22) Filed: Mar. 21, 2007

(65) Prior Publication Data

US 2007/0285133 A1    Dec. 13, 2007

(30) Foreign Application Priority Data

Mar. 31, 2006   (DE) .................. 10 2006 015 024

(51) Int. Cl.
*H03B 1/00* (2006.01)
*H03K 3/00* (2006.01)

(52) U.S. Cl. .................. 327/108; 327/427; 326/83
(58) Field of Classification Search ......... 327/108–112, 327/419, 427, 434; 326/82–87
See application file for complete search history.

(56) References Cited

U.S. PATENT DOCUMENTS

| | | | | |
|---|---|---|---|---|
| 5,365,118 A | * | 11/1994 | Wilcox ................ | 327/109 |
| 5,408,150 A | * | 4/1995 | Wilcox ................ | 327/108 |
| 5,469,094 A | * | 11/1995 | Nessi ................. | 327/110 |
| 6,556,062 B1 | * | 4/2003 | Wallace .............. | 327/434 |
| 6,556,407 B2 | * | 4/2003 | Brando et al. ....... | 361/100 |
| 6,703,874 B2 | * | 3/2004 | Katoh et al. ......... | 327/108 |
| 6,809,561 B2 | * | 10/2004 | Katoh et al. ......... | 327/108 |
| 7,034,600 B2 | * | 4/2006 | Scheikl ............... | 327/376 |
| 7,408,398 B2 | * | 8/2008 | Sander ................ | 327/427 |

* cited by examiner

*Primary Examiner*—Lincoln Donovan
*Assistant Examiner*—Patrick O'Neill
(74) *Attorney, Agent, or Firm*—Eschweiler & Associates, LLC

(57) ABSTRACT

A driver circuit for providing an output signal for switching an electrical load on and off has a field-effect transistor having a gate terminal and an output for providing the output signal to the electrical load, a buffer circuit connected to the gate terminal of the field-effect transistor to impress a charge change current on the gate terminal of the field-effect transistor based on a drive signal, and a comparator having a first input for receiving the gate voltage and a second input for receiving the output signal to determine whether the gate voltage and the output voltage fulfill a predetermined relationship with respect to each other, and to provide the drive signal to the buffer circuit so that the charge change current is changed in magnitude when the predetermined relationship is fulfilled as compared to the charge change current when the predetermined relationship is not fulfilled.

22 Claims, 5 Drawing Sheets

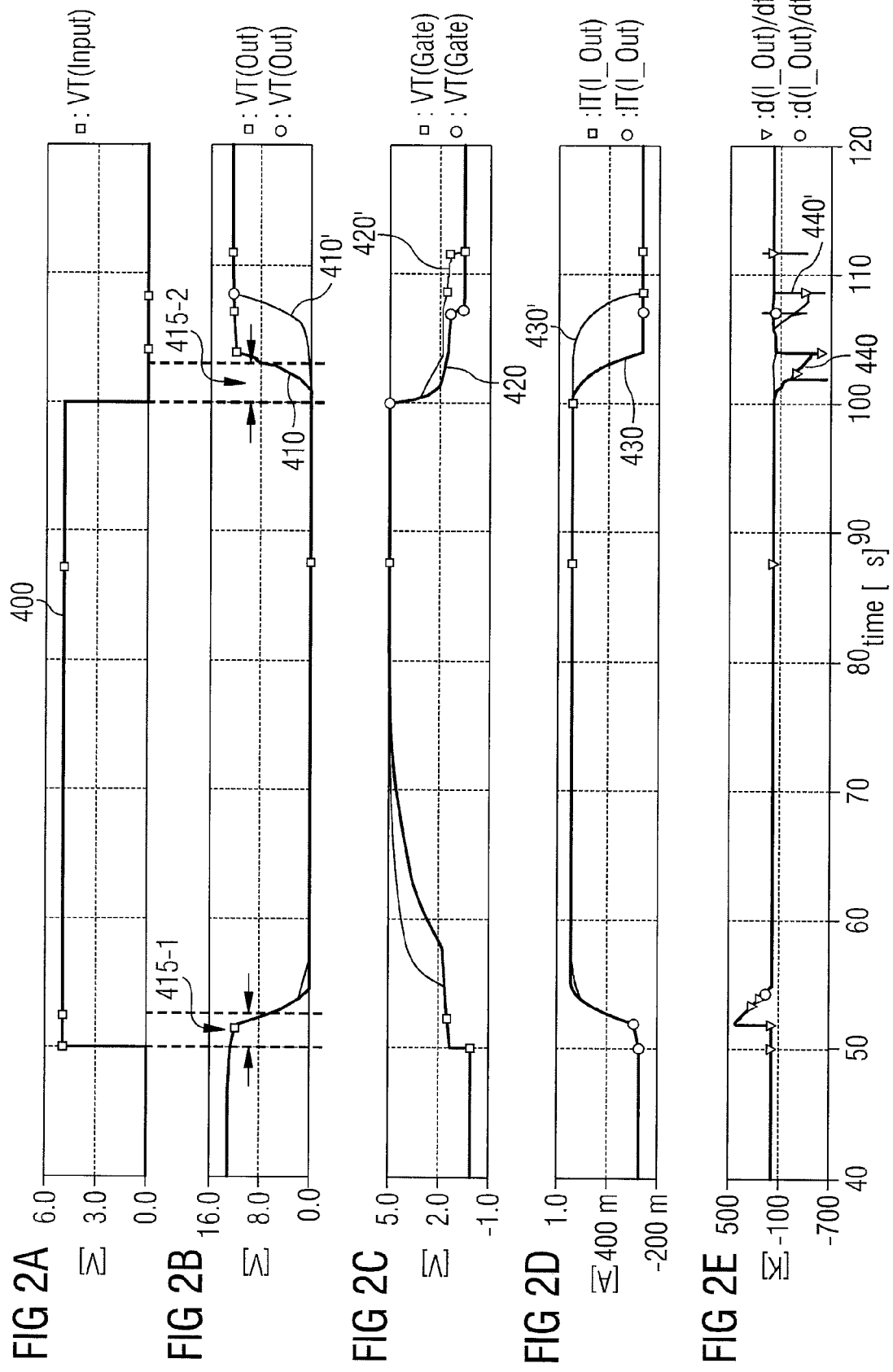

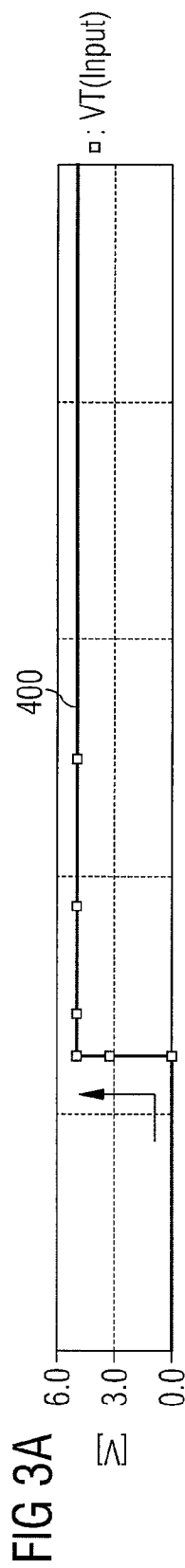
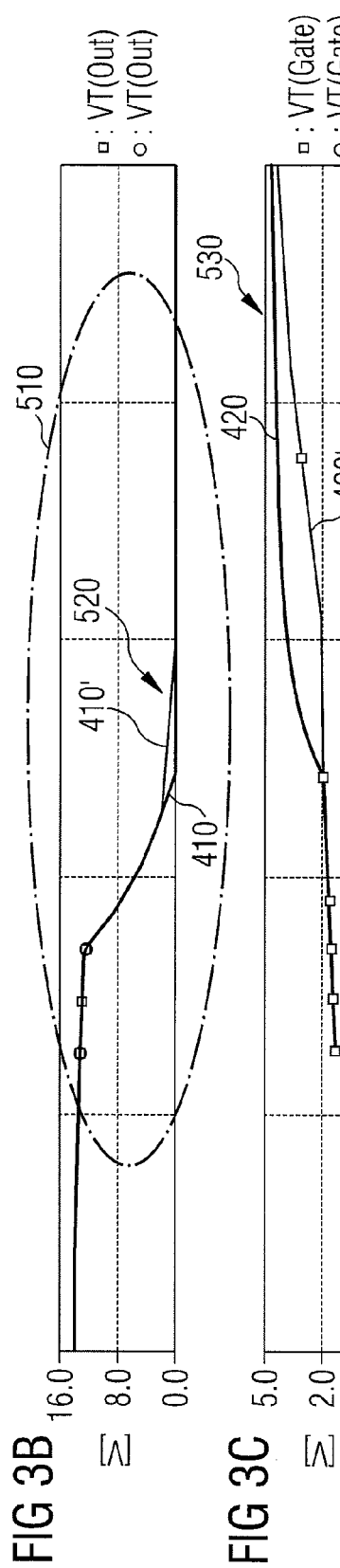
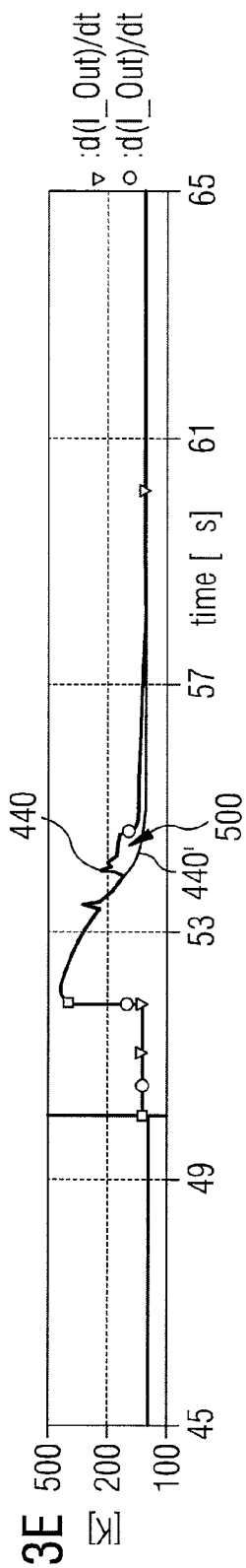

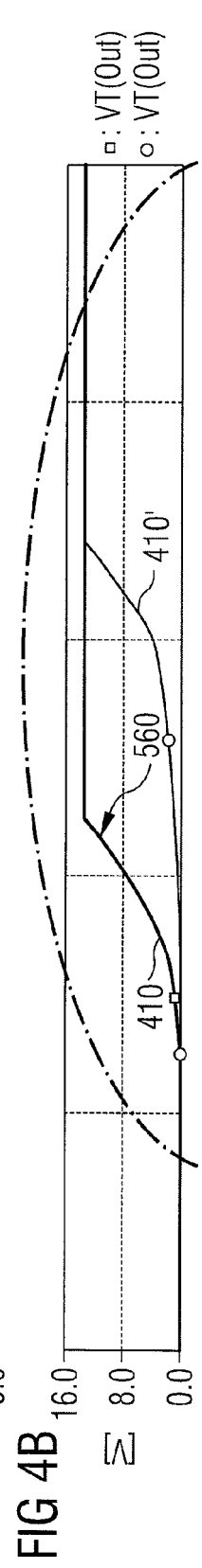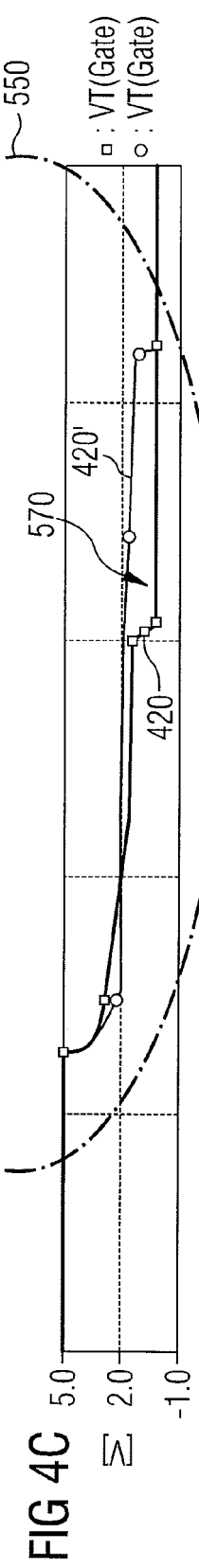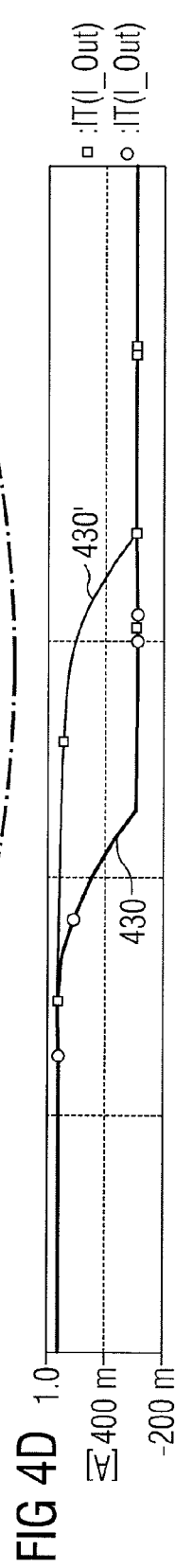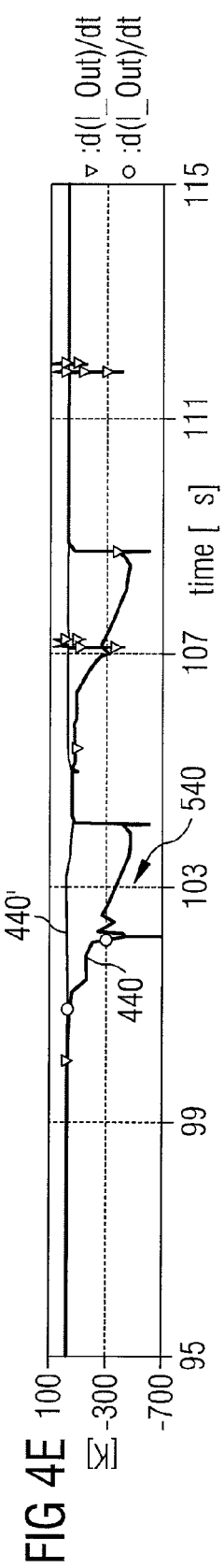

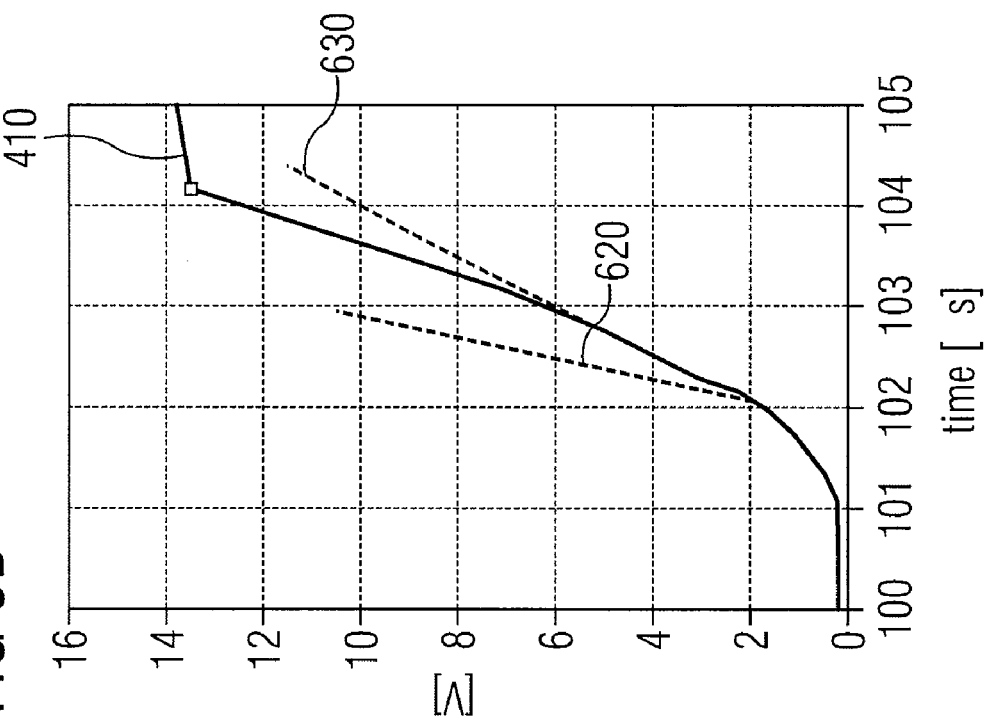
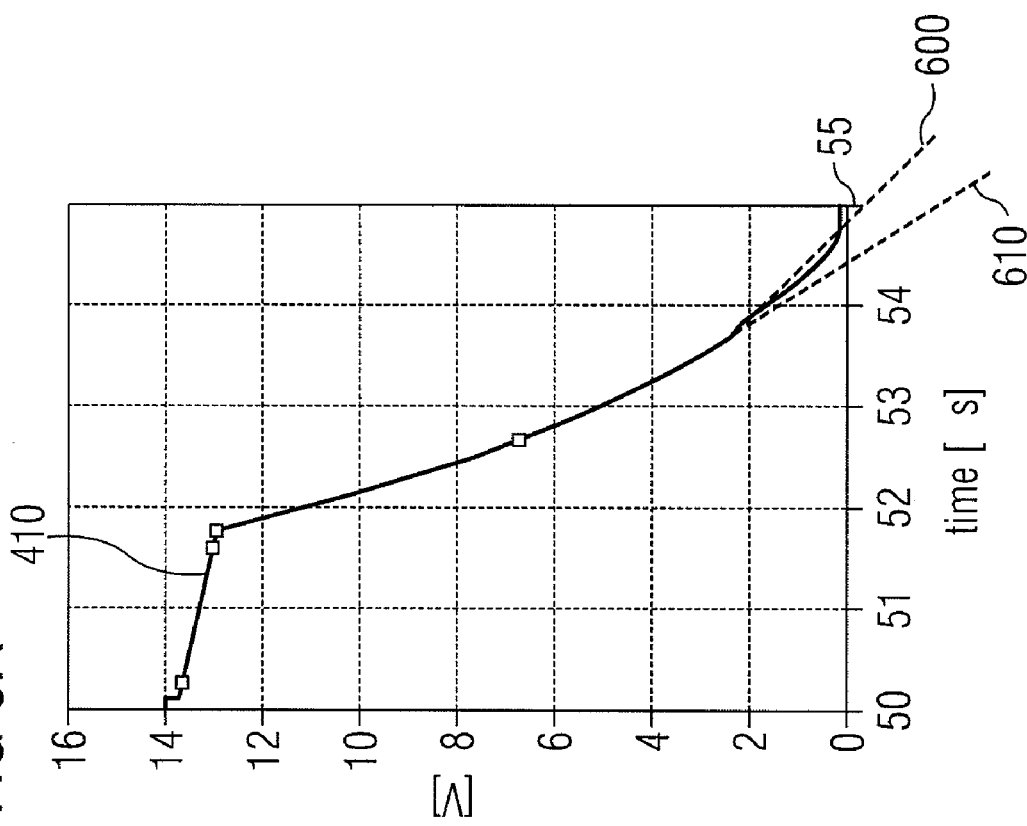

DRIVER CIRCUIT FOR PROVIDING AN OUTPUT SIGNAL

RELATED APPLICATION

This application claims priority from German Patent Application No. 10 2006 015 024.4, which was filed on Mar. 31, 2006, and is incorporated herein by reference in its entirety.

TECHNICAL FIELD

The present invention relates to a driver circuit for providing an output signal for switching an electrical load on and off, particularly to a driver circuit with a field-effect transistor for switching high current components and high power ICs (IC=integrated circuit) on and off, such as magnetic coils in the field of valve control or gears.

BACKGROUND

Known driver stages or power driver circuits for driving the loads include high power transistors. In references, various schemes are known and partially even patented, in which a control of a rounding of a slope of characteristic curves of the concerned transistors or the control of a slew rate of a field-effect transistor, i.e. a drain/source voltage Vds of the field-effect transistor of the output stage as compared to a charge of the gate electrode of the buffer stage are mentioned. These schemes often use various (protectable) buffer circuits with various strengths for controlling their associated output stages. Further known schemes use reference currents (bias currents) generated by bandgap reference sources for controlling the slew rate within their buffer circuits to achieve charging or discharging of, for example, a gate electrode of a field-effect transistor with a constant current. Other techniques measure voltage supply changes and then use a slew rate compensation in their buffer circuits.

The disadvantage of these schemes is that they do not take into account the need for an adapted switching behavior. Particularly the aspect of the duty cycle, i.e. the ratio of a turn-on time divided by a turn-off time, is not taken into account. Neither do these schemes take into account that the output stage including the transistor may be considerably loaded depending on the supply conditions, i.e. may be subjected to considerable stress.

As a further consequence, systems with a high inductive load and free-wheeling diodes, so-called circulation diodes, have considerable deficiencies with respect to target current accuracy and/or charge current accuracy.

An active reference current network is known, which compensates for a change of the reference current caused by hot-carrier injection and representing a common phenomenon in existing metal-oxide semiconductor transistors (MOS transistors) and particularly in laterally diffused MOS transistors (LDMOS). The known active reference network first measures the reference current flowing through a target transistor and compares it to a stable reference current. The difference between the reference current in the target transistor and the reference current is then used to adjust the reference current in the target transistor with a current mirror feedback circuit. The reference current of the target transistor is thus stable and independent of influences by hot-carrier injection on the reference current and other alterations of the reference current due to unfavorable circumstances. A MOS transistor used for measuring the reference current is operated in the linear region (triode region) of its characteristic curve and thus has minimal influence on the performance of the target transistor.

SUMMARY

A driver circuit for providing an output signal for switching an electrical load on and off may have a field-effect transistor having a gate terminal and an output for providing the output signal to the electrical load, a buffer circuit connected to the gate terminal of the field-effect transistor and formed to impress a charge change current on the gate terminal of the field-effect transistor based on a drive signal, and a comparator having a first input for receiving the gate voltage and a second input for receiving the output signal, wherein the comparator is formed to determine whether the gate voltage and the output voltage fulfill a predetermined relationship with respect to each other, and to provide the drive signal to the buffer circuit so that the charge change current is changed in magnitude when the predetermined relationship is fulfilled, as compared to the charge change current when the gate voltage and the output signal do not fulfill the predetermined relationship with respect to each other.

BRIEF DESCRIPTION OF THE DRAWINGS

Preferred embodiments will be explained in more detail below with respect to the accompanying drawings, in which:

FIGS. 2A to 2E represent a comparison of five waveforms of a typical switch-on and switch-off switching sequence with and without controlled switching based on the example of the embodiment of the driver circuit shown in FIG. 1;

FIGS. 3A to 3E show an enlargement of the switch-on process shown in FIG. 2;

FIGS. 4A to 4E show an enlargement of the switch-off process shown in FIG. 2; and FIGS. 5A and 5B show a behavior of the output signal when switching on (A) and switching off (B).

DETAILED DESCRIPTION

Figure 1:
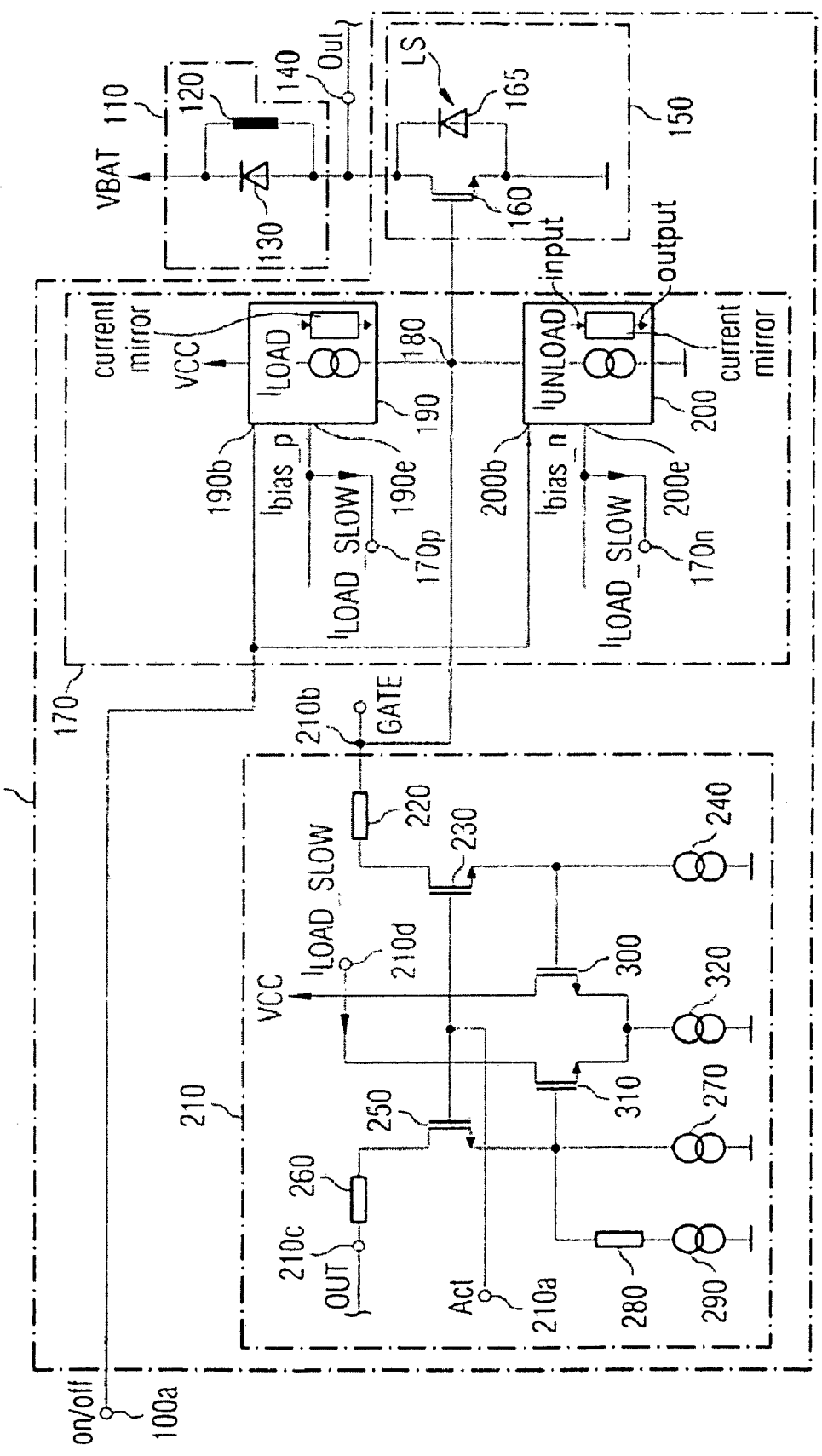
FIG. 1 shows a circuit diagram of an embodiment of a driver circuit as a low-side switch.

According to the embodiments, faster switching and a duty cycle that is better balanced may be achieved by determining an operating point of the output stage actively, using this information for the modulation of a current mirror circuit for charging or discharging the gate electrode of the field-effect transistor, allowing to control the slope of the output signal. A driver circuit according to an embodiment may be used both as part of a (high power) low-side switch and as part of a (high power) high-side switch.

In addition to the advantages already mentioned provided by the different embodiments, e.g., a better balanced duty cycle and faster switching, which is particularly advantageous for magnetic coil systems with free-wheeling diodes and/or circulation diodes when there is a constant current, it provides further advantages. For example, the fast switching behavior that may be attributed to the changed charge change current and results in charging or discharging the gate electrode with a high current, causes a minimization of the power losses and/or power dissipation, while the field-effect transistor of the output stage operates in its linear operating range and/or its triode range.

As the embodiments described on the following pages of the application will show, the goal to determine the operating point of a (high power) driver circuit can be achieved and this information can be used for a suitable control of the switch-on process and the switch-off process of the (high power) driver circuit. The driver circuit according to an embodiment may be used both as low-side switch and as high-side switch, for example in connection with a DMOS transistor (DMOS=double-diffused metal oxide semiconductor). In the present application, a low-side switch is understood to be a switch connected between a reference potential, for example ground, and an electrical load, which is, in turn, coupled to a (positive) supply voltage. In a typical connection scenario, a high-side switch is thus, on the one hand, connected to a (positive) supply voltage and, on the other hand, to the electrical load, while the electrical load is further connected to a reference potential, such as ground.

As a consequence of the determination of the operating point and the use of the corresponding information, this allows to achieve an optimized and/or better controlled pass-through time, i.e. an optimization of the time following between a reception of an input signal "switch on" ("high") and a subsequent output signal of the driver circuit "switch on" ("high") and/or the time following between an input signal "switch off" ("low") and the subsequent output signal "switch off" ("low"). Especially for magnetic coil driver circuits with a constant current, this allows a better adjustment of the duty cycle, i.e. the ratio of the turn-on time divided by the turn-off time, and faster switching.

FIG. 1 shows an embodiment of a driver circuit 100 for providing an output signal for switching an electrical load 110 on and off.

The electrical load 110 is connected to a (positive) external supply voltage VBAT, for example a battery voltage, and includes a parallel connection of an inductance 120 and a reverse-operated diode 130, i.e. that is connected to the positive supply voltage VBAT with a cathode terminal. For example, the load 110 is a magnetic coil 120 with a free-wheeling diode 130 connected in parallel, which, for example, shorts voltage peaks caused by induction, which are opposite to the positive supply voltage VBAT, bypassing the magnetic coil 120. The electrical load 110 is connected to the driver circuit 100 at an output 140 referred to as "out" in FIG. 1.

The driver circuit 100 includes an output stage 150 having a field-effect transistor 160, a buffer circuit 170 and a comparator and/or comparing circuit 210. The driver circuit 100 includes an input 100a for receiving a switch-on or switch-off signal for actuating the load 110 connected to the output 140 of the driver circuit.

The output stage 150 includes the field-effect transistor 160, which is an enhancement high power NMOS field-effect transistor in the preferred embodiment shown in FIG. 1. The field-effect transistor 160 is coupled to the output 140 of the driver circuit 100 with a drain terminal. In addition, the field-effect transistor 160 is connected to a reference potential (for example ground) with a source terminal. The drain terminal and the source terminal of the field-effect transistor 160 are additionally connected to a free-wheeling diode 165, wherein a cathode terminal of the free-wheeling diode 165 is connected to the drain terminal and an anode terminal of the free-wheeling diode 165 is connected to the source terminal of the field-effect transistor. Depending on the implementation of the field-effect transistor 160, the free-wheeling diode 165 may, for example, be included therein. The field-effect transistor 160 is additionally connected to the buffer circuit 170 with a gate terminal via a node 180 of the buffer circuit 170.

The buffer circuit 170 additionally comprises a charge current source 190 and a discharge current source 200 respectively connected to the node 180. The charge current source 190 is connected to a positive supply voltage VCC, while the discharge current source 200 is coupled to the reference potential. Both current sources 190, 200 each additionally comprise a control input 190e, 200e, which are each connected to a bandgap reference current source, which are not shown in FIG. 1. A reference current (bias current) $I_{bias\_p}$ is impressed on the charge current source 190 via its control input 190e. Analogously, a bias current $I_{bias\_n}$ is impressed on the discharge current source 200 via its control input 200e. In addition, the control input 190e of the charge current source 190 is connected to a first drive terminal 170p of the buffer circuit 170. Analogously, the control input 200e of the discharge current source 200 is connected to a second drive terminal 170n of the buffer circuit 170. Furthermore, the two current sources 190, 200 each comprise an actuating input 190b, 200b coupled to the input 100a of the driver circuit 100.

The two current sources 190, 200 generate a current, which they supply to the node 180 and/or draw off it depending on the connection based on the current impressed on their respective control inputs 190e, 200e. The current sources 190, 200 may, for example, be implemented in the form of current mirror circuits. In this case, the two control inputs 190e, 200e of the two current sources 190, 200 are connected to an input branch of the current mirror circuit, while the node 180 is connected to the output branch of the current mirror circuits of the two current sources 190, 200, respectively. The output branch of the current mirror circuit provides a current proportional to a current going in at the input branch. Due to the additional connections of the control inputs 190e, 200e of the two current sources 190, 200 to the first drive terminal 170p and the second drive terminal 170n of the buffer circuit 100, by additional impressing or drawing of a current $I_{LOAD\_SLOW}$ starting from the bias currents $I_{bias\_p}$ and $I_{bias\_n}$ of the bandgap reference current sources not shown in FIG. 1, the currents provided to the node 180 may be influenced by the two current sources 190, 200. The two current sources 190, 200 are designed so that the charge current source 190 is, for example, driven and/or activated when an actuating signal "on" and/or "high" is applied to its actuating input 190b. In this case, the discharge current source 200, which is also provided with the corresponding actuating signal via its actuating input 200b, is deactivated. If the control signal and/or the actuating signal is switched from the state "on" and/or "high" to the state "off" and/or "low" by a switching element outside the circuit shown in FIG. 1 via the input 100a, the charge current source 190 is deactivated, while the discharge current source 200 is activated due to the input signal "off" and/or "low" present at its actuating input 200b. The two current sources 190, 200 are thus alternatively activated by the actuating signal "on" or "off". To be more precise, the charge current source 190 is activated and the discharge current source 200 is deactivated with actuating signal "on", while the charge current source 190 is deactivated and the discharge current source 200 is activated with an actuating signal "off".

Optionally, it is possible, by deliberately switching off and/or connecting the respective bandgap reference current sources, to deliberately switch the two current sources 190, 200 on or off by impressing the respective bias current on the control input. In this case, an implementation of the actuating inputs 190b, 200b may optionally also be omitted.

The comparing means 210 of the driver circuit 100 comprises a first input 210a, with which the comparing means 210 may be switched on or off. In this way, the leakage current at the output 140 of the driver circuit 100 may be reduced to a minimum in the switched-off state. To be more precise, by providing an activation signal (act) at the input 210a of the comparing means 210, the same may be switched on or off. In an active operating mode, the comparing means 210 is in an activated state by providing an activation signal signaling switching on.

However, in order to also allow switching off of both the two current sources 190, 200 and the comparing means 210, an activation signal of the comparing means 210 may be provided to the first input 210a of the comparing means 210 (which is, for example, delayed in time with respect to a control signal at the input 100a of the driver circuit 100), the activation signal switching off the comparing means 210. In this way, both the comparing means 210 and the buffer circuit 170 may be deactivated and/or connected to be without current after switching on or switching off the electrical load. In addition, the driver circuit 210 comprises a second input 210b, a third input 210c and a fourth terminal 210d.

The node 180 of the buffer circuit 170 is connected to the second input 210b of the comparing means 210 and further to a first resistor 220. The first resistor 220 is further connected to a first terminal of a first transistor 230. With a second terminal, the first transistor 230 is connected to a current source 240 and further to the reference potential. The first input 210a of the comparing means 210 is connected to a control terminal of the first transistor 230 as well as to a control terminal of a second transistor 250. In addition, the second transistor 250 is attached to a second resistor 260 with a first terminal and further to the third input 210c of the comparing means 210. With a second terminal, the second transistor 250 is connected to a second current source 270 and further to the reference potential. In addition, the second terminal of the second transistor 250 is connected to a third current source 290 via a third resistor 280 and further to the reference potential. The output 140 of the driver circuit 100 is coupled to the third terminal 210c of the comparing means 210 with a connection not shown in FIG. 1 for reasons of clarity. In FIG. 1, this connection is illustrated by a wave-shaped line.

The comparing means 210 additionally comprises a third transistor 300 and a fourth transistor 310. The third transistor 300 is connected to the second terminal of the first transistor 230 with a control terminal. In addition, the third transistor 300 is connected to the positive supply voltage VCC with a first terminal and to the reference potential with a second terminal via a fourth current source 320. The fourth transistor 310 is coupled to the fourth terminal 210d of the comparing means 210 with a first terminal. With a second terminal, the fourth transistor 310 is also coupled to the reference potential via the fourth current source 320. The four transistors 230, 250, 300 and 310 may, in principle, each be implemented either as bipolar transistors or also as field-effect transistors.

In addition to the connection of the node 180 to the second input 210b of the comparing means 210, the comparing means 210 is also coupled to the buffer circuit 170 via the fourth terminal 210d. The fourth terminal 210d is indirectly or directly coupled to one or both of the drive terminals 170p, 170n of the buffer circuit 170. The coupling of the fourth terminal 210d and the two drive terminals 170p, 170n may, for example, be effected via a switch means allowing to couple the fourth terminal 210d to none, one or both of the control inputs 190e, 200e via the respective drive terminals. In this way, the comparing means 210 may provide the current $I_{LOAD\_SLOW}$ as drive signal to the buffer circuit 170 and/or draw it therefrom. The switch means not shown in FIG. 1 may, for example, also be switched via the input signal provided at the input 100a of the driver circuit 100.

In the embodiment shown in FIG. 1, the connection of the comparing means 210 and the buffer circuit 170 is designed so that the fourth current source 320 draws the current $I_{LOAD\_SLOW}$ from one or both of the current sources 190, 200 at their respective control inputs 190e, 200e in cooperation with the third transistor 300 and the fourth transistor 310, so that the current provided by the two current sources 190, 200 at the node 180 and thus to the gate electrode of the field-effect transistor 160 is influenced. The current flowing from the node 180 to the gate terminal of the field-effect transistor 160 represents the charge change current influencing the field-effect transistor 160. Depending on the implementation of the switch means, only one of the two current sources 190, 200 may, for example, be activated during charging and/or discharging of the gate electrode of the field-effect transistor 160 by providing a corresponding bias current and by providing the corresponding drive signal in the form of the current $I_{LOAD\_SLOW}$ as drive signal. In this case, the fourth terminal 210d of the comparing means 210 may be coupled to the respective control input 190e and/or 200e of the corresponding current source 190, 200 by the switch means mentioned above. Alternatively, it is also possible to operate both current sources 190, 200 during the charging or discharging of the gate electrode of the field-effect transistor 160. In this case, the drive signal may be provided to both current sources 190, 200. This may be realized, for example, by coupling the fourth terminal 210d of the comparing means 210 to both drive terminals 170p, 170n at the same time via a corresponding current mirror circuit with two output branches. In addition, it is basically also possible to leave both current sources 190, 200 switched on permanently. However, this requires that both current sources 190, 200 impress currents of equal magnitude on the node 180 and/or draw them therefrom to avoid unwanted charging of the gate electrode of the field-effect transistor 160.

In the following, the operation of the driver circuit, according to an embodiment, allowing controlled switching via a determination of the operating point of the output of the driver circuit 100 is described. According to an embodiment, the driver circuit 100 may, in principle, be divided into two blocks, i.e. the comparing means 210 for determining the operating point and the buffer and output stage 150, 170. The circuit of the comparing means 210 determines the operating point of the output stage 150. Essentially, a determination is made whether the (current) operating point of the output stage 150 is in the saturation range or in the triode range and/or a linear range. If the driver current 100 receives a control signal at the input 100a to switch on and/or off the electrical load 110, the comparing means 210 drives the buffer and output stage 150 and/or the corresponding circuits. The control signal received at the first input 210a of the comparing means 210 may, for example, be generated by a central SPI infrastructure (SPI=serial peripheral interface) or another logic circuit block element. As a result, the buffer circuit 170 charges or discharges a gate electrode of the output stage and/or a field-effect transistor 160 taking into account the provided control signal, which may assume the two states "high" (on and/or switch on) or "low" (off and/or switch off).

The operating point of the output stage 160 is monitored, wherein the comparing means 210 checks whether a drain-source voltage Vds of the field-effect transistor 160 is larger than or equal to a difference of a gate-source voltage Vgs and a threshold voltage Vth of the field-effect transistor 160. If the determination of the operating point of the output stage 160 has the result that it is in the triode operating mode, i.e. Vds≦Vgs−Vth, the current mirror circuits of the two current sources 190, 200 are driven so that they are completely "opened". Correspondingly, in the case of the saturation operating mode, i.e. if Vds≧Vgs−Vth, the current mirror circuits are "closed" or slightly disconnected, so that a lower charge change current is provided by the buffer circuit 170 of the output stage 160. Such a current mirror circuit control may be realized by implementing an analog switch and/or an analog switching means that limits an achievable accuracy of the current mirror properties of the two current sources 190, 200 only insignificantly.

The driver circuit 100 achieves, according to an embodiment, charging and discharging of the gate electrode of the output stage and/or the field-effect transistor 160 during the operation in the triode range with a full current provided by the two current sources 190, 200. This results in a significant improvement of the duty cycle with respect to switching the electrical load 110 on and off (on/off). In addition, according to an embodiment, the driver circuit 100 also allows a faster through-connection, i.e. faster and/or shorter pass-through times, thus putting less stress on the output stage and/or the field-effect transistor 160 without generating an increased voltage change (dV/dt) at the output 140 of the driver circuit 100 and thus an increased electromagnetic radiation. In this context, it is important that, when there is a high drain-source voltage Vds, which is given by a difference of the external supply voltage and/or the battery voltage VBAT and a voltage drop Vs across the electrical load 110, the charge change current of the buffer circuit 170 is reduced as compared to the maximum current. This is achieved by the comparing means 210 drawing the current $I_{LOAD\_SLOW}$ with a current value of one or both of the current inputs 190e, 200e of the two current sources 190, 200 via the fourth terminal 210d, so that a correspondingly changed output current as compared to that generated in the triode range of the field-effect transistor 160 is provided thereto.

In order to explain the behavior of the driver circuit 100 in more detail, FIG. 2 shows a comparison of five waveforms of a typical switch-on and switch-off switching sequence. Here, the five waveforms as a function of time are not only compared to each other, but the behavior of the driver circuit 100, according to an embodiment, with activated comparing means 210 is also compared to the behavior of a driver circuit in which the gate electrode of the field-effect transistor 160 is charged with a constant current. In the following, "controlled switching" means switching using the driver circuit 100, according to an embodiment, where the comparing means 210 thus influences the buffer circuit 170. In contrast, in the following, "uncontrolled switching" means using a driver circuit in which the buffer circuit impresses a constant current on the field-effect transistor during charge-reversing of the gate electrode. For example, FIG. 2A, at the top, shows a waveform 400 of the control signal as a function of time, as it is provided at the input 100a of the driver circuit 100. At a time of 50 μs, the control signal 400 provided to the input 100a changes from a value of 0 volts ("low" and/or "off") to a value of about 5 volts ("high" and/or "on"). At a time of about 100 μs, the waveform of the control signal 400 shows a corresponding return of the control signal from about 5 volts to 0 volts.

FIG. 2B shows a plotting of a waveform 410 of the output signal with control switching and a waveform 410' of the output signal with uncontrolled switching. This part of the illustration additionally includes a turn-on period 415-1 and a turn-off period 415-2 for a better explanation of the term duty cycle. Duty cycle means the ratio of the turn-on times to the turn-off times, i.e., in the present example, the ratio of the turn-on time 415-1 to the turn-off time 415-2. The period of the turn-on time 415-1 extends from the time 50 μs, at which the control signal changed from "low" to "high", to a time of about 52 μs, at which the output signal dropped from a value of about 14 volts to about 5 volts. Analogously, the turn-off period 415-2 extends from the time 100 μs, at which the control signal waveform 400 comprises a change from "high" to "low", to about 103 μs, at which the output signal waveform 410 has again reached a value of about 5 volts.

A first comparison of the two output signal waveforms 410 and 410' shows that, in the region of switching on, the output signal with controlled switching drops faster to a value of 0 volts than it is the case for the uncontrolled switching. The difference of the two waveforms 410 and 410' is much clearer in the region of switching off. For example, the output signal waveform 410 with controlled switching comprises a significantly faster rise than the output signal waveform 410'. While the turn-on period 415-1 relates to both waveforms 410, 410', because both output signal waveforms 410, 410' are similar in this time period, the turn-off period 415-2 relates to the output signal waveform 410 and comprises a length of about 3 μs, as it has just been described. With respect to the output signal waveform 410' with uncontrolled switching, a corresponding turn-off period would comprise a length of about 8 μs. A comparison of these numeral values clearly shows that the driver circuit 100, according to an embodiment, results in a significant improvement of the duty cycle.

FIG. 2C shows a waveform 420 of the gate voltage with controlled switching and a waveform of the gate voltage 420' with uncontrolled switching. The two gate voltage waveforms 420, 420' also clearly show the influence of the comparing means 210 both in the region of switching on and in the region of switching off, which, however, will be explained in more detail in connection with FIGS. 3 and 4, which include enlargements of the switch-on process and the switch-off process.

FIG. 2D shows a waveform 430 of the current flowing through the field-effect transistor 160 in the case of the driver circuit 100, according to an embodiment, i.e. with controlled switching. In addition, this part of the illustration also shows a waveform 430' of the current flowing through the field-effect transistor 160 in the case of uncontrolled switching. This part of the illustration also very clearly shows the intervention of the comparing means 210 of the driver circuit 100, according to an embodiment. However, for more details reference is also made to the description of FIGS. 3 and 4.

Finally, FIG. 2E shows a current change waveform 440 of the current through the field-effect transistor 160 with controlled switching. Analogously, the bottom part of the illustration of FIG. 2 also shows a current change waveform 440' of the current flowing through the field-effect transistor 160 with uncontrolled switching. Both current change waveforms 440 and 440' represent derivatives with respect to the time of the two current waveforms 430 and 430', which is why they are designated dI/dt in FIG. 2E.

FIG. 3 shows an enlargement of the region of the switch-on process already illustrated in FIG. 2. To be more precise, FIG. 3 shows a time period from 45 μs to 65 μs. At a time of about 54 μs, there is an adjustment of the charge change current due to the intervention of the comparing means 210, which results in a faster switching of the field-effect transistor 160. In the switched-off state, i.e. at a time prior to 50 μs, the external supply voltage VBAT essentially drops completely across the field-effect transistor 160, so that there is no significant voltage drop across the electrical load 110 itself. As, in the embodiment shown in FIG. 1, the field-effect transistor 160 is an enhancement NMOS field-effect transistor, it thus has a small gate-source voltage as compared to the drain-source voltage. Thus, the field-effect transistor 160 is in the saturation range. Due to the structure of the comparing means 210, a current with a high current value $I_{LOADSLOW}$ is drawn from the control input 190e via the fourth terminal 210d of the comparing means 210 and via the fourth current source 230, because, in the case of an activated comparing means 210, the switch-on signal "on" and/or "high" is present at the first input 210a of the comparing means 210 as activation signal, and thus the first transistor 230 and the second transistor 250 are connected to be conductive, while a switch-on signal is present at the actuating input 190b. The charge current source 190 is thus provided with a current value reduced with respect to the current $I_{bias\_p}$ by the current $I_{LOAD\_SLOW}$ at the control input 190e, so that the charge current source 190 impresses a low charge change current into the node 180, which is supplied to the gate electrode of the field-effect transistor 160. As soon as at the time at which the input signal signals switching on of the electrical load 110, at which the input signal and/or the control signal thus changes from the state "low" to the state "high", the two gate voltage waveforms 420 and 420' comprise a jump-like change of the gate voltage, which can be attributed to a property of a drive circuit not illustrated in FIG. 1. At the same time, there is a slight increase of the current flowing through the field-effect transistor 160 in both current waveforms 430 and 430' in FIG. 3D. At a time of about 52 µs, the gate voltage reaches the threshold value of the field-effect transistor 160, so that the two output signal waveforms comprise a significant change in their waveform. From this time, the drain-source voltage Vds of the field-effect transistor starts to decrease significantly, which, at the same time, results in a significant current through the transistor, which is shown both by the two current waveforms 430 and 430' in FIG. 3D and the current change waveforms 440 and 440' in FIG. 3E.

At a time of about 54 µs, the field-effect transistor 160 transitions from the saturation range to the triode range. At this time, the drain-source voltage Vds has thus fallen below the difference of the gate-source voltage Vgs and the threshold voltage Vth of the field-effect transistor 160. This has the result that the third transistor 300 is connected to be increasingly conductive, while the fourth transistor 310 increasingly blocks. As a result, the current of the fourth current source 320 is increasingly passed to ground via the positive supply voltage VCC, so that the drive signal in the form of the current $I_{LOAD\_SLOW}$ decreases in magnitude. In this way, less current is drawn via the first drive terminal 170p of the buffer circuit 170 and the fourth terminal 210d of the comparing means 210, so that the charge current source 190 impresses a larger current into the node 180, which, in turn, results in an increased charge change current for the gate electrode of the field-effect transistor 160.

This also becomes apparent in the current change waveform 440 in comparison with the current change waveform 440', as shown by marking 500. The marking 500 thus indicates the time at which the comparing means 210 has detected the entry of the operating point into the triode range of the field-effect transistor 160. The consequent increase of the charge change current, i.e. the increase of the charge current of the gate electrode of the field-effect transistor 160, is shown not only in the current change waveforms and/or in the dI/dt waveforms 440 and 440', but also in the two current waveforms 430 and 430'.

However, this is shown much more clearly by the output signal waveforms 410 and 410' and the gate voltage waveforms 420 and 420' in FIG. 3C (marking 510). As shown by marking 520, the output signal waveform 410, which is based on controlled switching, reaches the state of complete through-connection, i.e. a drain-source voltage Vds of the field-effect transistor 160 of about 0 volts, much faster than the output signal waveform 410' based on uncontrolled switching. As shown by marking 530, the charge of the gate electrode also reaches its maximum value much faster in the case of controlled switching than in the case of uncontrolled switching, so that the gate voltage waveform 420 also approaches a value of the positive supply voltage VCC and/or VDD of the field-effect transistor 160 much faster than the gate voltage waveform 420'. The markings 500 to 530 thus show that the driver circuit 100, according to an embodiment, allowing controlled switching enables a significantly faster switching on of the electrical load 110 as compared to a driver circuit without controlled switching.

FIG. 4 shows an enlargement of the comparison of the signal waveforms 400, 410, 410', 420, 420', 430, 430', 440, and 440', which is shown in FIG. 2, in a period between 95 µs and 115 µs, in which a signal resulting in switching the electrical load 110 off is provided to the driver circuit 100 at the input 100a of the driver circuit 100. As already explained in connection with FIG. 2, the waveform 400 in FIG. 4a comprises a transition from the state "high" corresponding to a voltage value of about 5 volts to a state "low" corresponding to a voltage value of about 0 volt at a time of 100 µs.

Before the input signal 400 changes from the state "high" to the state "low", the field-effect transistor 160 is in the triode range. In this case, the drain-source voltage Vds is very low, so that the external supply voltage VBAT essentially drops across the electrical load 110. At the same time, the gate-source voltage Vgs of the field-effect transistor 160 is large as compared to the drain-source voltage, because the field-effect transistor 160 is an enhancement field-effect transistor. For this reason, the comparing means 210 detects the presence of the operating point in the triode range already about 1.5 µs after the input signal has arrived at the input 100a of the driver circuit 100 in the case of controlled switching in the case of the driver circuit 100, according to an embodiment. This is clearly shown by the current change waveform 440 in FIG. 4E in comparison with the current change waveform 440' (marking 540). As already explained above, this results in an increase of the discharge current by the comparing means 210, wherein, in this case, the discharge current source 200 draws the corresponding charge change current from the node 180 and thus from the gate electrode of the field-effect transistor 160.

In contrast, the current change waveform 440' resulting in the case of uncontrolled switching exhibits a significantly gentler drop. This is also reflected in the associated current waveforms 430 and 430'. For example, the current waveform 430 has a value differing only insignificantly from the final current value through the field-effect transistor 160 of about 0 A as soon as at a time of about 104 µs. In comparison, the current waveform 430' has a nearly unchanged value at this time and reaches a current value of about 0 A only at a time of about 108.5 µs.

This is shown even more clearly by the output signal waveforms 410 and 410' in FIG. 4B and the gate voltage waveforms 420 and 420' in FIG. 4C (marking 550). As shown by marking 560, the output signal waveform 410, i.e. the drain-source voltage Vds of the field-effect transistor 160, has a value approximately corresponding to the battery voltage VBAT significantly faster than this is shown by the output signal waveform 410'. A comparison of the output signal waveforms 410 and 410' thus shows that switching off of the electrical load 110 may also be achieved significantly faster by using the driver circuit 100, according to an embodiment, wherein the output signal Vds and/or out in this case increases from a value of about 0 volt to a value of approximately 14 volts, because, in this case, the battery voltage VBAT drops completely across the field-effect transistor 160 and no longer across the electrical load 110.

As shown by marking 570, the charge of the gate electrode and/or the gate voltage also reaches a value of the negative supply voltage (VSS), which, in the present example, is the reference potential and/or ground, i.e. 0 volts, significantly faster with the help of the driver circuit 100, according to an embodiment, allowing controlled switching as compared to a driver circuit only allowing uncontrolled switching.

FIG. 5 shows a comparison of the output signal waveforms 410 at the time of switching on (FIG. 5A) and at the time of switching off (FIG. 5B). FIG. 5A shows a falling edge of the output signal waveform 410, which corresponds to switching on the low-side switch in the form of the driver circuit 100 ("on"). During the switching on of the low-side switch, i.e. the through-connection of the field-effect transistor 160, there is a significant change of a slope of the output signal waveform 410 due to the intervention of the comparing means 210. Thus, just before the intervention of the comparing means 210 resulting in an adjustment of the charge change current by the buffer circuit 170 which is impressed on the gate electrode of the field-effect transistor 160, FIG. 5A shows a slope less in magnitude than a slope after the charge change current was increased by the comparing means 210. For illustration, FIG. 5A includes a tangent 600 at a point just before the comparing means 210 has detected the transition of the operating point from the saturation range to the triode range and has correspondingly increased the charge change current in magnitude, and a tangent 610 applied to a point of the output signal waveform 410 at which an increased charge change current has already been impressed on the gate electrode of the field-effect transistor 160 due to the intervention of the comparing means 210. In other words, the intervention of the comparing means 210 may be also verified by a direct electrical measurement of the output signal at the output 140 of the driver circuit 100, according to an embodiment, and/or the associated pin. For example, the tangent 600 associated with a low charge change current also has a slope of less magnitude than the tangent 610 associated with the charge change current increased by the intervention of the comparing means 210.

FIG. 5B shows the clearly noticeable change of a slope of the output signal waveform 410 in the case of switching off the low-side switch 160. FIG. 5B thus shows a rising edge of the output signal waveform 410 corresponding to switching off the low-side switch in the form of the driver circuit 100 ("off"). For example, in FIG. 5B, a tangent 620 and 630, respectively, has been adapted to the output signal waveform 410 of the field-effect transistor 160 just before the change of the operating point of the field-effect transistor 160 from the triode range to the saturation range. The tangent 620 corresponds to a high charge change current impressed on the gate electrode of the field-effect transistor 160 by the intervention of the comparing means 210 by the buffer circuit 170. However, the tangent 630 has been adapted to a point of the output signal waveform 410 after the operating point of the field-effect transistor 160 has transitioned to the saturation range, so that the charge change current is reduced with respect to that on which tangent 620 was based. Here, the tangent 620 thus also comprises a slope significantly larger in magnitude in the triode range of the field-effect transistor 160 than the tangent 630 adapted in the saturation range.

Even if US 2004/0046609 A1 describes a device for controlling a reference current and a compensation thereof, measurement schemes, the methods, the objectives and the achieved objectives are completely different from those of the present invention, as they will be described within the present application. In addition, US 2004/0046609 A1 does not describe the behavior of the present invention and/or its embodiments in any way.

The driver circuit, according to an embodiment, may, for example, be used as part of high power ICs (IC=integrated circuit). A possible field of application thus is, for example, the automobile sector in the area of valve control systems for transmission, servo-assisted steering and other systems in which hydraulic systems require an intelligent driving of valves. An driver circuit may, according to an embodiment, however, also be used, for example, in other high current applications or high power applications, such as in laboratories. In addition, the driver circuit, according to an embodiment, may be used not only in an integrated circuit, but also in the form of discrete circuits.

Even if the above embodiments were directed to a low-side switch, an driver circuit may, according to an embodiment, for example, also be implemented as part of a high-side switch as high-side switch driver circuit. In addition, not only enhancement NMOS transistors may be used as part of the driver circuit 100, according to an embodiment, but there may also be used other field-effect transistors or bipolar transistors. Also, the field-effect transistor 160 does not necessarily have to be implemented as enhancement NMOS transistor. For example, it may be implemented as PMOS transistor, as normally-on field-effect transistor or as a transistor with a combination of these features.

The current sources 190, 200 of the embodiment of a driver circuit 100 shown in FIG. 1 also do not necessarily have to comprise a current mirror circuit. Thus, it is conceivable in principle that the two current sources comprise a resistive element depending on a drive signal, so that, by corresponding driving of this resistive element, for example a transistor, a current may be modified depending on the drive signal. It is also conceivable that, instead of two separate current sources 190, 200, a single current source is used, which is used both for charging and discharging the gate electrode of the field-effect transistor 160.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A driver circuit for providing an output signal for switching an electrical load on and off, comprising:
    a field-effect transistor comprising a gate terminal and an output for providing the output signal to the electrical load;
    a buffer circuit connected to the gate terminal of the field-effect transistor and formed to impress a charge change current at the gate terminal of the field-effect transistor and based on a drive signal; and
    a comparator comprising a first input for receiving a gate voltage of the field-effect transistor and a second input for receiving the output signal,
    wherein the comparator is formed to determine whether the gate voltage and the output voltage fulfill a predetermined relationship with respect to each other, and to provide the drive signal to the buffer circuit so that, when the predetermined relationship is fulfilled, the charge change current is changed in magnitude as compared to a charge change current when the predetermined relationship is not fulfilled.

2. The driver circuit according to claim 1, wherein the driver circuit comprises an input for receiving a control signal to effect switching on and/or switching off of the electrical load.

3. The driver circuit according to claim 2, wherein the comparator is formed to provide the drive signal to the buffer circuit when a control signal is applied that effects switching on of the electrical load, and when the predetermined relationship is fulfilled, so that the charge change current at the field-effect transistor increases; and to provide the drive signal to the buffer circuit when the control signal is applied which effects the switching off of the electrical load, and when the predetermined relationship is fulfilled, so that the charge change current at the field-effect transistor is reduced.

4. The driver circuit according to claim 1, wherein the buffer circuit comprises a current source, wherein the current source comprises a current mirror circuit with a current mirror input terminal and a current mirror output terminal, wherein the current mirror output terminal is coupled to the gate terminal of the field-effect transistor, wherein the current mirror input terminal is coupled to the comparator to receive the drive signal, wherein the drive signal is a current, and wherein the current mirror circuit is formed to provide a current at the current mirror output terminal that is proportional to a current arriving at the current mirror input terminal.

5. The driver circuit according to claim 4, wherein a reference current is additionally impressed on the current mirror circuit at the current mirror input terminal.

6. The driver circuit according to claim 1, wherein the comparator comprises a third input for receiving an activation signal to allow the comparator to be switched on and off.

7. The driver circuit according to claim 6, wherein the comparator comprises:

a first transistor comprising a first terminal, a second terminal and a control terminal;

a second transistor comprising a first terminal, a second terminal and a control terminal;

a third transistor comprising a first terminal, a second terminal and a control terminal;

a fourth transistor comprising a first terminal, a second terminal and a control terminal; and a first current source, wherein the first transistor is coupled to the first input of the comparator with the first terminal, to the control terminal of the second terminal with the second terminal and to the third input of the comparator with the control terminal, wherein the second transistor is coupled to a supply voltage with the first terminal and to the first current source with the second terminal, wherein the third transistor is coupled to a fourth terminal of the comparator with the first terminal, to the first current source with the second terminal and to the second terminal of the fourth transistor with the control terminal, wherein the fourth transistor is coupled to the second input of the comparator with the first terminal and to the third input of the comparator with the control terminal, and wherein the first current source is further connected to a reference potential.

8. The driver circuit according to claim 7, wherein the comparator further comprises a second current source coupled to the reference potential and the second terminal of the first transistor, and a third current source coupled to the reference potential and the second terminal of the fourth transistor.

9. The driver circuit according to claim 8, wherein the comparator further comprises a fourth current source and a first resistor, wherein the fourth current source is coupled to the reference potential and to the control terminal of the third transistor via the first resistor.

10. The driver circuit according to claim 8, wherein the comparator further comprises a second resistor connected between the first terminal of the first transistor and the first input of the comparator, and a third resistor connected between the first terminal of the fourth transistor and the second input of the comparator.

11. The driver circuit according to claim 7, wherein the first transistor, the second transistor, the third transistor or the fourth transistor is a field-effect transistor, so that the first terminal is a drain terminal, the second terminal is a source terminal, and the control terminal is a gate terminal.

12. A method for providing an output signal for switching an electrical load on and off, comprising:

providing a field-effect transistor comprising a gate terminal and an output for providing the output signal to the electrical load;

impressing a charge change current at the gate terminal of the field-effect transistor based on a drive signal by a buffer circuit connected to the gate terminal of the field-effect transistor; and comparing a gate voltage of the field-effect transistor and the output signal by a comparator to determine whether the gate voltage and the output voltage fulfill a predetermined relationship with respect to each other, and to provide the drive signal to the buffer circuit so that, when the predetermined relationship is fulfilled, the charge change current is changed in magnitude as compared to a charge change current when the predetermined relationship is not fulfilled.

13. The method according to claim 12, further comprising the step of receiving a control signal to effect switching on and/or switching off of the electrical load.

14. The method according to claim 13, wherein the drive signal is fed to the buffer circuit when a control signal is applied that effects switching on of the electrical load, and when the predetermined relationship is fulfilled, so that the charge change current at the field-effect transistor increases; and wherein the drive signal is fed to the buffer circuit when the control signal is applied which effects the switching off of the electrical load, and when the predetermined relationship is fulfilled, so that the charge change current at the field-effect transistor is reduced.

15. The method according to claim 12, comprising the step of receiving an activation signal to allow the comparator to be switched on and off.

16. A driver circuit for providing an output signal for switching an electrical load on and off, comprising:

a field-effect transistor comprising a gate terminal and an output for providing the output signal to the electrical load;

a buffer circuit connected to the gate terminal of the field-effect transistor and formed to impress a charge change current at the gate terminal of the field-effect transistor based on a drive signal; and a comparator comprising a first input for receiving a gate voltage of the field-effect transistor and a second input for receiving the output signal, wherein the comparator is formed to determine whether the gate voltage and the output voltage fulfill a predetermined relationship with respect to each other, and to provide the drive signal to the buffer circuit so that, when the predetermined relationship is fulfilled, the charge change current is changed in magnitude as compared to a charge change current when the predetermined relationship is not fulfilled, wherein the driver circuit comprises an input for receiving a control signal to effect switching on and/or switching off of the electrical load, wherein the comparator is formed to provide the drive signal to the buffer circuit when a control signal is applied that effects switching on of the electrical load, and when the predetermined relationship is fulfilled, so that the charge change current at the field-effect transistor increases, and to provide the drive signal to the buffer circuit when the control signal is applied which effects the switching off of the electrical load, and when the predetermined relationship is fulfilled, so that the charge change current at the field-effect transistor is reduced.

17. The driver circuit according to claim 16, wherein the buffer circuit comprises a current source, wherein the current source comprises a current mirror circuit with a current mirror input terminal and a current mirror output terminal, wherein the current mirror output terminal is coupled to the gate terminal of the field-effect transistor, wherein the current mirror input terminal is coupled to the comparator to receive the drive signal, wherein the drive signal is a current, and wherein the current mirror circuit is formed to provide a current at the current mirror output terminal that is proportional to a current arriving at the current mirror input terminal, wherein a reference current is additionally impressed on the current mirror circuit at the current mirror input terminal.

18. The driver circuit according to claim 16, wherein the comparator comprises a third input for receiving an activation signal to allow the comparator to be switched on and off, wherein the comparator comprises:
a first transistor comprising a first terminal, a second terminal and a control terminal;
a second transistor comprising a first terminal, a second terminal and a control terminal;
a third transistor comprising a first terminal, a second terminal and a control terminal;
a fourth transistor comprising a first terminal, a second terminal and a control terminal; and
a first current source, wherein
the first transistor is coupled to the first input of the comparator with the first terminal, to the control terminal of the second terminal with the second terminal and to the third input of the comparator with the control terminal, wherein the second transistor is coupled to a supply voltage with the first terminal and to the first current source with the second terminal, wherein the third transistor is coupled to a fourth terminal of the comparator with the first terminal, to the first current source with the second terminal and to the second terminal of the fourth transistor with the control terminal, wherein the fourth transistor is coupled to the second input of the comparator with the first terminal and to the third input of the comparator with the control terminal, and wherein the first current source is further connected to a reference potential.

19. The driver circuit according to claim 18, wherein the comparator further comprises a second current source coupled to the reference potential and the second terminal of the first transistor, and a third current source coupled to the reference potential and the second terminal of the fourth transistor.

20. The driver circuit according to claim 18, wherein the comparator further comprises a fourth current source and a first resistor, wherein the fourth current source is coupled to the reference potential and to the control terminal of the third transistor via the first resistor.

21. A driver circuit for providing an output signal for switching an electrical load on and off, comprising:
a field-effect transistor comprising a gate terminal and an output for providing the output signal to the electrical load;
a buffer circuit connected to the gate terminal of the field-effect transistor and formed to impress a charge change current at the gate terminal of the field-effect transistor based on a drive signal;
a comparator comprising a first input for receiving a gate voltage of the field-effect transistor and a second input for receiving the output signal;
wherein the comparator is formed to determine whether the gate voltage and the output voltage fulfill a predetermined relationship with respect to each other, and to provide the drive signal to the buffer circuit so that, when the predetermined relationship is fulfilled, the charge change current is changed in magnitude as compared to a charge change current when the predetermined relationship is not fulfilled;
wherein the comparator comprises a third input for receiving an activation signal to allow the comparator to be switched on and off; and
wherein the comparator comprises:
a first transistor comprising a first terminal, a second terminal and a control terminal;
a second transistor comprising a first terminal, a second terminal and a control terminal;
a third transistor comprising a first terminal, a second terminal and a control terminal;
a fourth transistor comprising a first terminal, a second terminal and a control terminal; and
a first current source,
wherein the first transistor is coupled to the first input of the comparator with the first terminal, to the control terminal of the second terminal with the second terminal and to the third input of the comparator with the control terminal,
wherein the second transistor is coupled to a supply voltage with the first terminal and to the first current source with the second terminal,
wherein the third transistor is coupled to a fourth terminal of the comparator with the first terminal, to the first current source with the second terminal and to the second terminal of the fourth transistor with the control terminal,
wherein the fourth transistor is coupled to the second input of the comparator with the first terminal and to the third input of the comparator with the control terminal, and
wherein the first current source is further connected to a reference potential.

22. A driver circuit for providing an output signal for switching an electrical load on and off, comprising:
a field-effect transistor comprising a gate terminal and an output for providing the output signal to the electrical load;
a buffer circuit connected to the gate terminal of the field-effect transistor and formed to impress a charge change current at the gate terminal of the field-effect transistor based on a drive signal; and a comparator comprising a first input for receiving a gate voltage of the field-effect trnasistor and a second input for receiving the output signal, wherein the comparator is formed to determine whether the gate voltage and the output voltage fulfill a predetermined relationship with respect to each other, and to provide the drive signal to the buffer circuit so that, when the predetermined relationship is fulfilled, the charge change current is changed in magnitude as compared to a charge change current when the predetermined relationship is not fulfilled, wherein the driver circuit comprises an input for receiving a control signal to effect switching on or switching off of the electrical load, wherein the comparator is formed to provide the drive signal to the buffer circuit when a control signal is applied that effects switching on of the electrical load, and when the predetermined relationship is fulfilled, so that the charge change current at the field-effect transistor increases; and to provide the drive signal to the buffer circuit when the control signal is applied which effects the switching off of the electrical load, and when the predetermined relationship is fulfilled , so that the charge change current at the field-effect transistor is reduced, wherein the comparator comprises a third input for receiving an activation signal to allow the comparator to be switched on and off, and wherein the comparator comprises:
  a first transistor comprising a first terminal, a second terminal and a control terminal;
  a second transistor comprising a first terminal, a second terminal and a control terminal;
  a third transistor comprising a first terminal, a second terminal and a control terminal;
  a fourth transistor comprising a first terminal, a second terminal and a control terminal; and
  a first current source,
  wherein the first transistor is coupled to the first input of the comparator with the first terminal, to the control terminal of the second terminal with the second terminal and to the third input of the comparator with the control terminal,
  wherein the second transistor is coupled to a supply voltage with the first terminal and to the first current source with the second terminal,
  wherein the third transistor is coupled to a fourth terminal of the comparator with the first terminal, to the first current source with the second terminal and to the second terminal of the fourth transistor with the control terminal,
  wherein the fourth transistor is coupled to the second input of the comparator with the first terminal and to the third input of the comparator with the control terminal, and
  wherein the first current source is further connected to a reference potential.

* * * * *